(12) United States Patent
Mutschler et al.

(10) Patent No.: US 8,810,791 B2
(45) Date of Patent: Aug. 19, 2014

(54) OPTOELECTRONIC SENSOR ELEMENT

(71) Applicant: Sick Stegmann GmbH, Donaueschingen (DE)

(72) Inventors: Reinhold Mutschler, Donaueschingen (DE); Ulrich Zwolfer, Waldkirch (DE)

(73) Assignee: Sick Stegmann GmbH, Donaueschingen (DE)

( * ) Notice: Subject to any disclaimer, the term of this patent is extended or adjusted under 35 U.S.C. 154(b) by 0 days.

(21) Appl. No.: 13/922,711

(22) Filed: Jun. 20, 2013

(65) Prior Publication Data

US 2013/0342840 A1    Dec. 26, 2013

(30) Foreign Application Priority Data

Jun. 22, 2012 (EP) .................................... 12173211

(51) Int. Cl.
| | |
|---|---|
| *G01J 4/00* | (2006.01) |
| *G01D 5/34* | (2006.01) |
| *G02B 5/30* | (2006.01) |
| *H01L 31/0216* | (2014.01) |
| *G01B 11/26* | (2006.01) |
| *G01J 4/04* | (2006.01) |
| *H01L 31/02* | (2006.01) |

(52) U.S. Cl.
CPC ............... *G01B 11/26* (2013.01); *G01D 5/345* (2013.01); *G02B 5/30* (2013.01); *H01L 31/02161* (2013.01); *G01J 4/04* (2013.01); *H01L 31/02024* (2013.01)
USPC .......................................... 356/364; 356/369

(58) Field of Classification Search
CPC ................ G02B 27/26; G02B 5/3058; G02B 2027/0178; G02B 5/30; G02B 5/3083; G02B 2027/014; G02B 27/017; G02B 27/28; G02B 27/283; G02B 27/286; G02B 27/0093; G02B 27/2214; G02B 5/3033; G02B 6/0068
See application file for complete search history.

(56) References Cited

U.S. PATENT DOCUMENTS

| | | | |
|---|---|---|---|
| 6,583,415 B2 * | 6/2003 | Stevens .......................... | 250/330 |
| 7,829,855 B2 * | 11/2010 | Reid et al. ................... | 250/341.3 |
| 2005/0002032 A1 * | 1/2005 | Wijntjes et al. ................ | 356/364 |
| 2007/0252992 A1 * | 11/2007 | Itsuji ............................ | 356/369 |
| 2008/0186491 A1 | 8/2008 | Baxter et al. | |
| 2009/0153842 A1 * | 6/2009 | Kaushal et al. ................. | 356/73 |

FOREIGN PATENT DOCUMENTS

| | | |
|---|---|---|
| DE | 102008014334 B4 | 12/2009 |
| EP | 1972909 A1 | 9/2008 |
| JP | 2011112786 | 6/2011 |

OTHER PUBLICATIONS

European Search Report for European Application No. 12173211.9.

* cited by examiner

*Primary Examiner* — Michael P Stafira
(74) *Attorney, Agent, or Firm* — Nath Goldberg & Meyer; Jerald L. Meyer

(57) ABSTRACT

The invention relates to an optoelectronic sensor element (20) having at least one reception element (22, 22a, 22b, 22c, 22d) in front of which a polarizing structure (24, 24a, 24b, 24c, 24d) is arranged which is manufactured from an electrically conductive material, with the polarizing structure (24, 24a, 24b, 24c, 24d) having a contact connection (26) for the application of a defined tension and with the polarizing structure (24, 24a, 24b, 24c, 24d) being configured as a screen of the sensor element (20).

11 Claims, 2 Drawing Sheets

OPTOELECTRONIC SENSOR ELEMENT

Figure 1:
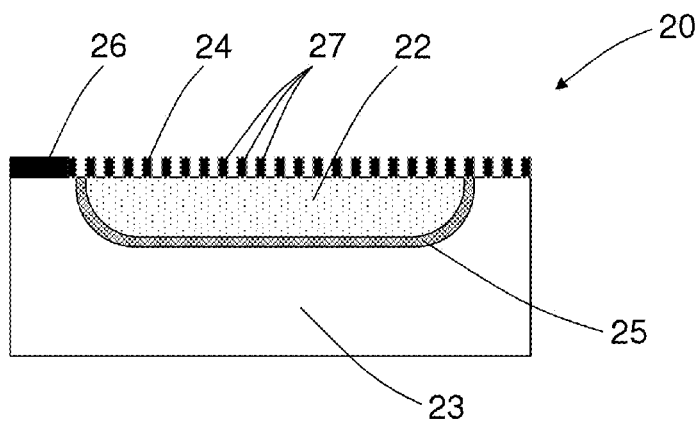

The invention relates to an optoelectronic sensor element in accordance with the preamble of patent claim 1.

Optoelectronic sensor elements are known having at least one reception element in front of which a polarizing structure is arranged which is made from an electrically conductive material.

For example, the DE 10 2008 014 334 B4 discloses an integrated polarization sensor having a polarization sensor element, with the polarization sensor element comprising an optoelectronic sensor and a polarization filter structure having at least one structured metal layer.

The EP 1 972 909 A1 discloses a luminescence sensor having a metallic wire grid polarization filter which also serves as a heating element, for which purpose the wire grid is connected to a voltage supply.

The US 2008/0186491 discloses a rotary actor having a metallic polarization filter.

The JP 2011 112 786 A discloses a liquid crystal display having a grounded wire grid polarizer for screening.

Optical reception elements, in particular photodiode structures in optical sensors are frequently sensitive with respect to capacitive couplings of electric noise, wherein the use of such sensors is hindered in a surrounding with a high noise potential.

For this reason the object of the invention consists therein to provide an optoelectronic sensor element which can be used in many applications, and in particular can be used in an environment having a high electric noise potential.

The object of the invention is satisfied by an optoelectronic sensor element having the features of the patent claim 1.

Advantageous embodiments and further developments of the invention are provided in the dependent claims.

The optoelectronic sensor element in accordance with the invention comprises at least one sensor element in front of which a polarization structure is arranged which is manufactured from an electronically conductive material. The optoelectronic sensor element in accordance with the invention is characterized in that the polarization structure has a contact connection for the application of a defined potential and in that the polarizing structure is configured as a screen of the sensor element. It is thereby enabled that the in anyway required and present metallic grid structures for the polarization can additionally be used for the screening against electric noise fields or electromagnetic interference such that, on the one hand, the electromagnetic compatibility can be improved by the screen, however, on the other hand, this can be realized without a significant portion of additional components.

Preferably, the polarizing structure is configured as electrically conductive strips which enables a simple and cost-effective manufacture.

Particularly preferably the polarizing structure is configured as a wire gratting polarizer which is also referred to as a wire grid polarizer, which simplifies the manufacture. The wire grid structures can be realized directly in the manufacturing process as metallization planes of the sensor and in this manner do not require an additional component, but rather can be directly integrated into the sensor. Alternatively, the wire grid structures can also be applied onto the glass frequently used for the covering of the sensor which glass is arranged above the reception elements of the sensor and adjusted relative to this.

Preferably, the wire grid polarizer has conductive strips whose width is smaller than the wavelength of the light and is arranged in a pattern which is approximately twice as large as the strip width which enables the use of an optoelectronic sensor element, in particular in cooperation with visible light.

Preferably, the wire grid polarizer has metallic strips having a width of approximately 200 nm which are arranged in a grid of approximately 400 nm which enables the use of the optoelectronic sensor element, in particular in connection with visible light.

Preferably the polarizing structure is manufactured of aluminum or of an aluminum alloy which enables a simple and cost-effective manufacture.

Particularly preferably, the contact connection is electrically conductively connected to the ground potential in order to provide a simple and reliable screening in this manner.

In accordance with a preferred embodiment of the invention the contact connection is formed as a connection surface. Such a connection surface permits, for the purpose of the electric screening, the contacting of the polarizing structure and, for example, to connect the polarizing structure to the ground of the sensor element. Thereby, in particular a Faraday cage can be formed which increases the noise resistance of the optoelectronic sensor element.

In accordance with a preferred embodiment of the invention at least one group comprising at least two reception elements is present, upstream of which a respective polarizing structure is arranged, with the polarization planes of the reception elements in the group being respectively rotated with respect to one another in the group, preferably by 180°/n, with n being the number of reception elements of the group. The use of at least two reception elements, preferably a plurality of reception elements improves the accuracy of the measurement element of the optoelectronic sensor element, since an averaging over the different optical channels can take place. The number of the reception elements with different polarization planes in this connection determines, in particular the number of the optical channels. Generally the polarization planes of the reception elements can be rotated with respect to one another by an arbitrary angle. In accordance with advantageous embodiment of the invention the polarization planes of the reception elements are respectively rotated with respect to one another by 180°/n, wherein n is the number of reception elements. In this manner an, in particular uniform averaging results over all polarization directions. If a plurality of groups of reception elements are used the resolution can additionally be improved by statistic averaging on use of a plurality of channels.

Particularly preferably an optoelectronic sensor element in accordance with the invention is used in an apparatus for the measurement of the rotary angle of two objects rotating relative to one another about an axis of rotation, having a light source associated with the one object, which light source transmits unpolarized light, having a polarizer, wherein the light source and the polarizer rotate relative to one another in dependence on the rotary angle and having a light receiver which measures the light intensity of light passing through the polarizer or light reflected from the polarizer in order to generate a signal dependent on the rotary angle.

Preferably, the light source and the receiver can be acted on by the same electric modulation frequency in an apparatus for the measurement of the rotary angle of two objects rotating relative to one another about an axis of rotation in order to become less sensitive with respect to electric offsets, for example, due to interference light or dark currents.

Preferably, a mirror is arranged behind the polarizer which mirror is arranged perpendicular to the axis of rotation which, in particular preferably rotates with the polarizer. This can enable a compact assembly.

Particularly preferably, a beam splitter is arranged in the beam optical path which, in particular is of non-polarizing design and which is provided to, on the one hand, a couple light in or out laterally and, on the other hand, to balance out axial tolerances.

Figure 2:
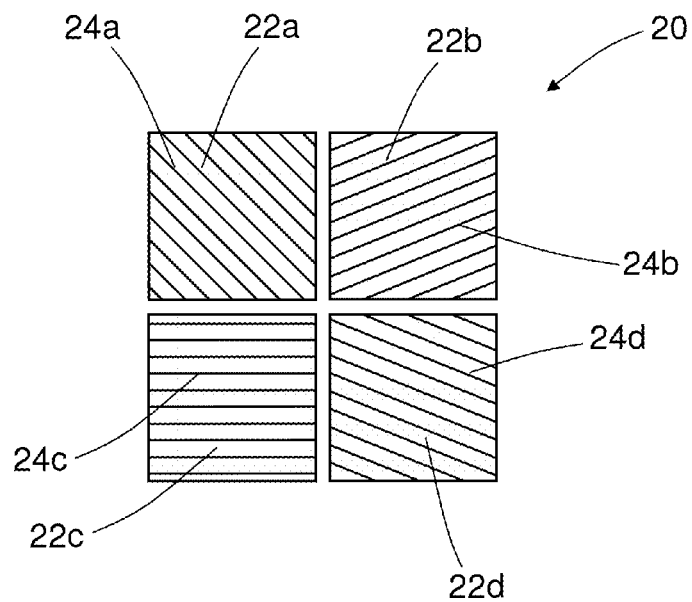
Figure 3:
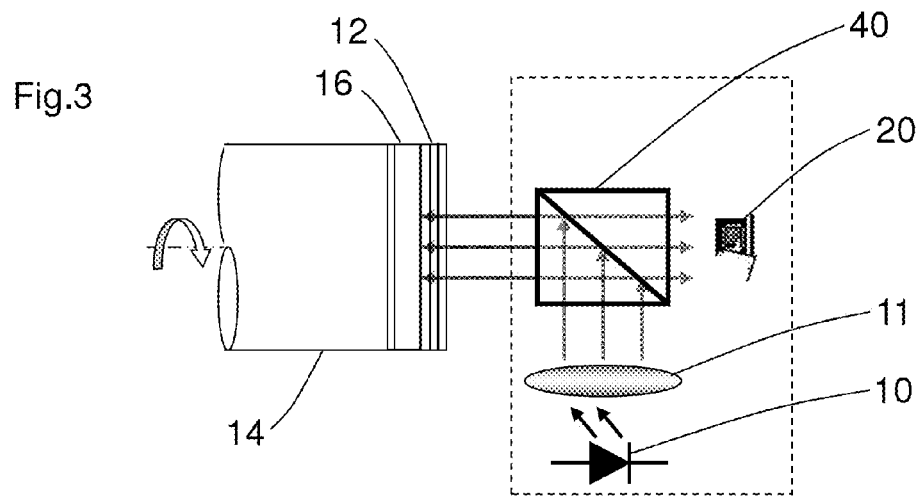
Figure 4:
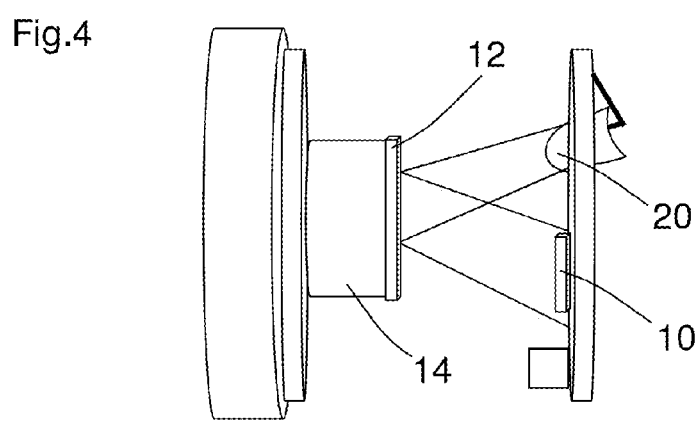
Figure 5:
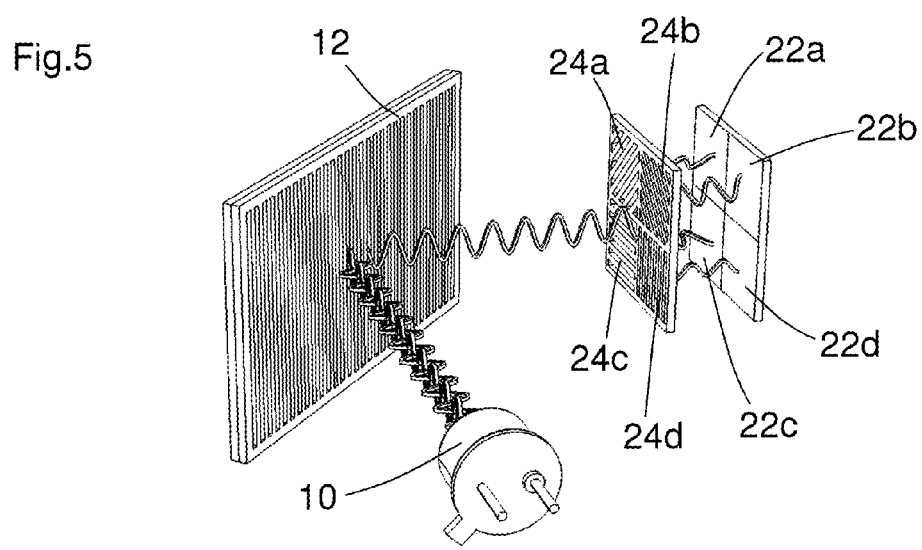

The invention will be described in the following with reference to the Figures in detail. There is shown:

FIG. 1 a schematic illustration of an optoelectronic sensor element having a reception element in an embodiment of the invention;

FIG. 2 a top view onto an embodiment of an optoelectronic sensor element having four reception elements;

FIG. 3 a schematic illustration of an apparatus for the measurement of a rotary angle of two objects rotating relative to one another in an embodiment of the invention;

FIG. 4 a schematic illustration of an apparatus for the measurement of a rotary angle of two objects rotating relative to one another in a further embodiment of the invention; and FIG. 5 a schematic illustration of the polarization planes of the light paths of the apparatus in accordance with FIG. 4.

FIG. 1 shows a schematic illustration of a longitudinal section through an embodiment of a sensor element 20 which has a reception element 22 which is in particular configured as a photodiode. The reception element 22 is in this connection in particular arranged on a support 23 configured as a P substrate arranged separate from the P substrate by a pn junction 25. In front of the reception element 22, this means on the side of the reception element facing the incident light, a polarizing structure 24 is arranged. The polarizing structure is made in particular of metal, for example of aluminum or an aluminum alloy.

The polarizing structure 24, for example, has a plurality of electrically conductive strips 27 spaced apart from one another and arranged in a grid and can, for example, be configured as a wire grid polarizer. The wire grid polarizer can, for example, have metal strips 27 having a width of 200 nm which are arranged in a grid of 400 nm so that the wire grid polarizer can, in particular be used with visible light.

The polarizing structure 24 has a contact connection 26 which in accordance with the present embodiment is configured as a connection surface and via which the polarizing structure 24 can be connected electrically conductively to a defined potential, for example, to the ground potential. The contact connection 26 can also be connected to a component having a defined potential in one piece or can be connected to a defined potential by means of a wire, a cable or the like.

As illustrated in FIG. 2, the optoelectronic sensor element 20 can have a plurality of reception elements, for example four reception elements 22a, 22b, 22c, 22d. Each of the reception elements 22a, 22b, 22c, 22d has a polarizing structure 24a, 24b, 24c, 24d, wherein the polarization planes of the different reception elements 22a, 22b, 22c, 22d are respectively rotated with regard to one another, for example by 180°/n, in the present embodiments thus by 45°. The use of at least two reception elements 22a, 22b, 22c, 22d leads to a corresponding number of optical channels which can be evaluated and possibly averaged in order to improve the measurement accuracy of the optoelectronic sensor element 20.

The optoelectronic sensor element 22 is in particular used in an apparatus for the measurement of the rotary angle of two optics rotating relative to one another about an axis of rotation. An embodiment of such an apparatus for the measurement of the rotary angle is shown in FIG. 3.

FIG. 3 schematically shows the beam optical path of an apparatus for the measurement of the rotary angle of two objects rotating relative to one another comprising a light source 10 which is configured as an unpolarized light source 10, for example as an LED. The light transmitted by the light source 10 is collimated by a lens 11 and is linearly polarized with the aid of a polarizer 12. In this connection the polarizer 12 is arranged at a rotating shaft 14. A mirror 16 is arranged between the polarizer 12 and the shaft 14, which mirror reflects back the light passing through the polarizer 12 and light polarized by this the polarizer 12. Alternatively, the polarizer 12 can also be of reflecting design so that the mirror 16 can be omitted. The polarizer 12 can be configured as a wire grid polarizer.

As illustrated in FIG. 3, the light source 10 is laterally arranged. The light transmitted by the light source 10 is coupled in by a beam splitter 40. The light reflected by the mirror 16 is incident on the optoelectronic sensor element 20 after passing through the beam splitter 14 which sensor element can, for example, be configured as illustrated in FIG. 1 or FIG. 2. The positions of the light source 10 and the receiver 20 can naturally be exchanged.

An arrangement as illustrated in FIG. 3 has the advantage that an axial beam extent is possible which has the effect that axial tolerances between the light source 10 and the shaft 14 can be balanced out. By means of the apparatus in accordance with FIG. 3, the rotary angle of two objects rotating relative to one another can be determined as follows, wherein presently merely an object is configured as rotating, namely the shaft 14, for example the shaft 14 of a motor, wherein the rotary angle of the shaft 14 should be determined with respect to a fixed part, for example a motor housing or a fixed machine part. The light source 10 is fixedly arranged and can, for example, be associated with the fixed part. In dependence on the rotary angle of the rotating shaft 14 the intensity of the light changes which is detected in the detection element 22 and is maximal when the polarization plane of the polarizer 12 coincides with the polarization plane of the polarizing structure 24 of the reception element 22 and minimal when the polarization plane of the polarizer 12 is perpendicular to the polarization plane of the polarizing structure 24 of the reception element 22. The rotary angle can in this manner be measured without further auxiliary means via a half rotation of the shaft 14. The use of a plurality of reception elements 22a, 22b, 22c, 22d leads to a corresponding number of optical channels which can be evaluated and possibly be averaged, whereby the accuracy of the measurement of the rotary angle can be improved.

Due to the fact that the polarizing structure 24 of the optoelectronic sensor element 20 is configured as a screen the electromagnetic compatibility of the optoelectronic sensor element is improved. The polarizing structure 24 can, for example, be directly configured in the manufacturing process as a metallization plane of the optoelectronic sensor element, so that no additional component is required in order to realize a screen, which simplifies the assembly of the optoelectronic sensor element and enables a cost-effective manufacture.

FIG. 4 shows an alternative embodiment of an apparatus for the measurement of a rotary angle of two objects rotating relative to one another which merely is different from the embodiment illustrated in FIG. 3 in that both the light source 10 and also the optoelectronic sensor element 20 are arranged at an angle with respect to the rotary axis, whereby the beam splitter 4 of the apparatus in accordance with FIG. 3 can be omitted.

FIG. 5 schematically shows the illustration of the polarization planes of the light paths of the apparatus illustrated in FIG. 4. The light source 10 radiates unpolarized light which is linearly polarized in the polarizer 12. The polarization planes of the polarizing structure 24a, 24b, 24c, 24d of the reception elements 22a, 22b, 22c, 22d rotated with respect to one another bring about a different intensity in the individual reception elements 22a, 22b, 22c, 22d and the formation of a plurality of optical channels which can be evaluated independent from one another.

LIST OF REFERENCE NUMERALS 10 light source
11 lens
12 polarizer
14 shaft
16 mirror
20 sensor element
22 reception element
22a reception element
22b reception element
22c reception element
22d reception element
23 support
24 polarizing structure
24a polarizing structure
24b polarizing structure
24c polarizing structure
24d polarizing structure
25 pn junction
26 contact connection
27 strip
40 beam splitter

The invention claimed is:

1. An apparatus for the measurement of the rotary angle of two objects rotating relative to one another about an axis of rotation, comprising:
a light source (10) associated with one of the objects and transmitting unpolarized light, a polarizer (12), wherein the light source (10) and the polarizer (12) rotate relative to one another in dependence on the rotary angle; and
a receiver which measures the light intensity passing through or reflected by the polarizer (12) in order to generate a signal dependent on an angle of rotation,
said the receiver being configured as an optoelectronic sensor element (20), having at least one group comprising at least two reception elements (22, 22a, 22b, 22c, 22d) in front of which reception elements a respective polarizing structure (24, 24a, 24b, 24c, 24d) is arranged, with the polarization planes of the reception elements being respectively rotated with respect to one another in the group, and which is made from an electrically conductive material;
said polarizing structure (24, 24a, 24b, 24c, 24d) having a contact connection (26) for the application of a defined potential and the polarizing structure (24, 24a, 24b, 24c, 24d) being configured as a screen for the sensor element (20).

2. The apparatus in accordance with claim 1, the polarizing structure (24, 24a, 24b, 24c, 24d) being made of electrically conductive strips (27).

3. The apparatus in accordance with claim 1, the polarizing structure (24, 24a, 24b, 24c, 24d) being configured as a wire grid polarizer.

4. The apparatus in accordance with claim 3, the wire grid polarizer further comprising conductive strips (27) whose width is smaller than the wavelength of the light and which are arranged in a grid which is twice as large as the strip width.

5. The apparatus in accordance with claim 1, the polarizing structure (24, 24a, 24b, 24c, 24d) being made of aluminum or an aluminum alloy.

6. The apparatus in accordance with claim 1, the contact connection being electrically conductively connected to the ground potential.

7. The apparatus in accordance with claim 1, the contact connection (26) being formed as a connection surface.

8. The apparatus in accordance with claim 1, the polarization planes of the reception elements (22a, 22b, 22c, 22d) being respectively rotated with respect to one another by 180°/n, with n being the number of reception elements (22a, 22b, 22c, 22d) of the group.

9. The apparatus in accordance with claim 1, wherein the light source (10) and the receiver can be acted on by the same electric modulation frequency.

10. The apparatus in accordance with claim 1, further comprising a mirror (16), said mirror being arranged behind the polarizer (12) and being arranged perpendicular to the axis of rotation.

11. The apparatus in accordance with claim 1, further comprising a beam splitter (40) arranged in the beam optical path.

* * * * *